356-138 CROSS REFERENCE SEARCH ROOM

May 6, 1969 H. R. ROTTMANN 3,442,583

MASK ALIGNMENT SYSTEM USING COHERENT FIBER BUNDLE

Filed Dec. 19, 1966

INVENTOR.
HANS R ROTTMANN
BY
John F. Ohlandt Jr.
ATTORNEY 3,442,583
MASK ALIGNMENT SYSTEM USING COHERENT FIBER BUNDLE Hans R. Rottmann, Poughkeepsie, N.Y., assignor to International Business Machines Corporation, Armonk, N.Y., a corporation of New York Filed Dec. 19, 1966, Ser. No. 602,735
Int. Cl. G03b *21/26, 21/28*
U.S. Cl. 353—34 7 Claims

ABSTRACT OF THE DISCLOSURE

A mask alignment system and technique particularly directed to the alignment of masks used in semiconductor integrated circuit fabrication in order to obtain alignment accuracy better than $\pm 40 \times 10^{-6}$ inches. Two microscopes are provided, one for each of the masks, and a coherent fiber bundle is placed in the optical path of one of the microscopes, thereby enabling the attainment of a proper depth of focus for each mask image and with a high degree of resolution so that the needed accuracy can be obtained.

This invention relates to a system for aligning pattern-bearing matrices, and more particularly, to an arrangement and a technique for aligning several of such matrices, which are usually in the form of photographic masks or so-called moly masks.

Because of the enormous interest that has developed recently in integrated circuitry it has become imperative that there be a ready capability for accurately aligning in various configurations the masks that are employed in the fabrication of such circuitry.

In the fabrication of semi-conductor devices in integrated circuit form it has become conventional to utilize a masking operation for the formation of minute devices within or on a substrate of semi-conductor material. In order to create a desired device configuration, for example within a substrate or monolith in accordance with well-known procedures, a photoresist pattern is developed to form an oxide film with the appropriate windows in it. The film or layer most usually consists of silicon oxide. Thus, suitable photoresist material is first laid over a continuous layer of oxide material. Thereafter the pattern for the selective etching through of the oxide layer down to the surface of the substrate is produced in the photoresist layer by suitable exposure of that photoresist layer to a predetermined light pattern. Generally, the light pattern is, as is well-known, obtained by using a photographic mask or moly(molybdenum) mask. By selective removal of the photoresist material, following exposure, the silicon oxide layer can be etched in the chosen pattern.

In the above described context of semi-conductor device manufacture in integrated circuit form, it has become extremely important where the desired light pattern is produced by photographic masking that a feasible and highly accurate technique be available for the aligning of several masks relative to each other so that desired patterns can be produced, for example, on opposite surfaces of a moly mask or wafer.

It will be appreciated from what follows that, although the alignment of photographic masks and the like has been noted above in connection with the semi-conductor technology in present widespread use, the necessity for masked alignment is frequently found in other technologies as well, and that the invention described herein is not to be considered as restricted to any particular technology. In fact, the present invention is generally applicable to any desired alignment of a plurality of pattern-bearing matrices, be they photographic masks or some other type of matrices, such as matrices constituted of an opaque material.

In the attempt to achieve reasonably accurate alignment of several masks, certain techniques or methods of alignment have been known. For example, one method that has been devised where one mask is placed on top of the other mask and both are viewed through a single low-power microscope of large depth of focus and low resolution in order to ascertain registration between both mask patterns. However, there is a notable lack in the above described alignment method in that such method can produce an accuracy that is limited to the order of $\pm 100 \times 10^{-6}$ inches. A further disadvantage of this alignment procedure is that, if a higher resolution must be used to obtain a greater alignment accuracy, the depth of focus may decrease to a point where alignment becomes impossible because of "fuzziness" of one of the images. As a result in such instance or, in those instances where the masks are separated by appreciable distances, the use of one microscope makes it impossible to accurately focus on both masks simultaneously.

Another method that has been used for mask alignment involves the use of a reticle. By using this reticle or cross hair arrangement, it is possible to line up the target pattern on each of the masks with the reticle in separate operations. However, inherent inaccuracy results because of the finite thickness of the reticle and the difficulty of lining up an edge of the target pattern precisely with an edge of the reticle.

Accordingly, it is a primary object of the present invention to overcome the aforenoted deficiencies and disadvantages possessed by the prior art in alignment of masks and the like.

Another object of invention is to align two or more masks by superimposing their images without reference to a reticle.

Another object is to facilitate alignment of masks without the necessity for complicated lens and mirror systems.

Yet another object is to permit the alignment of masks where such masks are located in random planes.

A further object is to provide mask alignment with an accuracy of better than $\pm 40 \times 10^{-6}$ inches.

The above objects are fulfilled in accordance with the primary features of the present invention. A basic feature of the present invention resides in the provision of what may be termed two-microscopes-in-one, combined with a coherent fiber bundle. This combination enables the attainment of increased depth of focus without decreasing the resolution. Thus, the two microscopes are arranged so as to yield two distinct images representing the masks although the separation of both masks is considerably greater than the depth of focus of the single objective. By virtue of the use of a coherent fiber bundle with sufficiently fine individual fibers the resolution thus obtained by means of the separate microscopes is not impaired and the images of the separate pattern-bearing matrices can be magnified and viewed together. In other words, the result is a facility for viewing well resolved, superimposed images of both matrices and consequently, for accurately aligning the matrices by aligning or registering these images.

As an illustrative embodiment there is provided a system by which two masks can be aligned. An objective lens is provided for each of these masks and is located on the outer side of each mask. Light is reflected from one of the masks and the image thereof which is produced by suitable means, including one of the objective lenses, is directed onto a viewing screen, for example. As illustratively embodied with transparent photographic masks, the light passing through both of the masks is directed through another objective lens and is reflected from a mirror so that a magnified image of the other mask is provided on the input of a coherent fiber bundle. The fiber bundle output places that image into a location where it can be superimposed on the first image.

It is also a noteworthy feature of the present invention that a special arrangement is provided for feeding back the second image. This arrangement comprises a coherent, image-transmitting fiber bundle which includes an extended group of clamped, aligned optical fibers. These optical fibers are formed in a flexible configuration such that the ends may be modulated. In this way, even though an individual fiber may be broken, or otherwise distorted, the image which is received at the input end will be reproduced properly at the output end and hence at the proper relationship at the viewing means.

In addition to the fact that extremely accurate alignment can be obtained in the described embodiment where the several masks are considered to be separated by an appreciable distance, the broad technique of the present invention allows one to align through opaque media. Thus, where either the material of the mask is opaque or where the masks are located on opposite surfaces of an opaque member, such as a semiconductor wafer or the like, the necessary accurate alignment can be achieved.

The foregoing and other objects, features and advantages of the invention will be apparent from the following more particular description of preferred embodiments of the invention, as illustrated in the accompanying drawings.

Figures 1, 2:
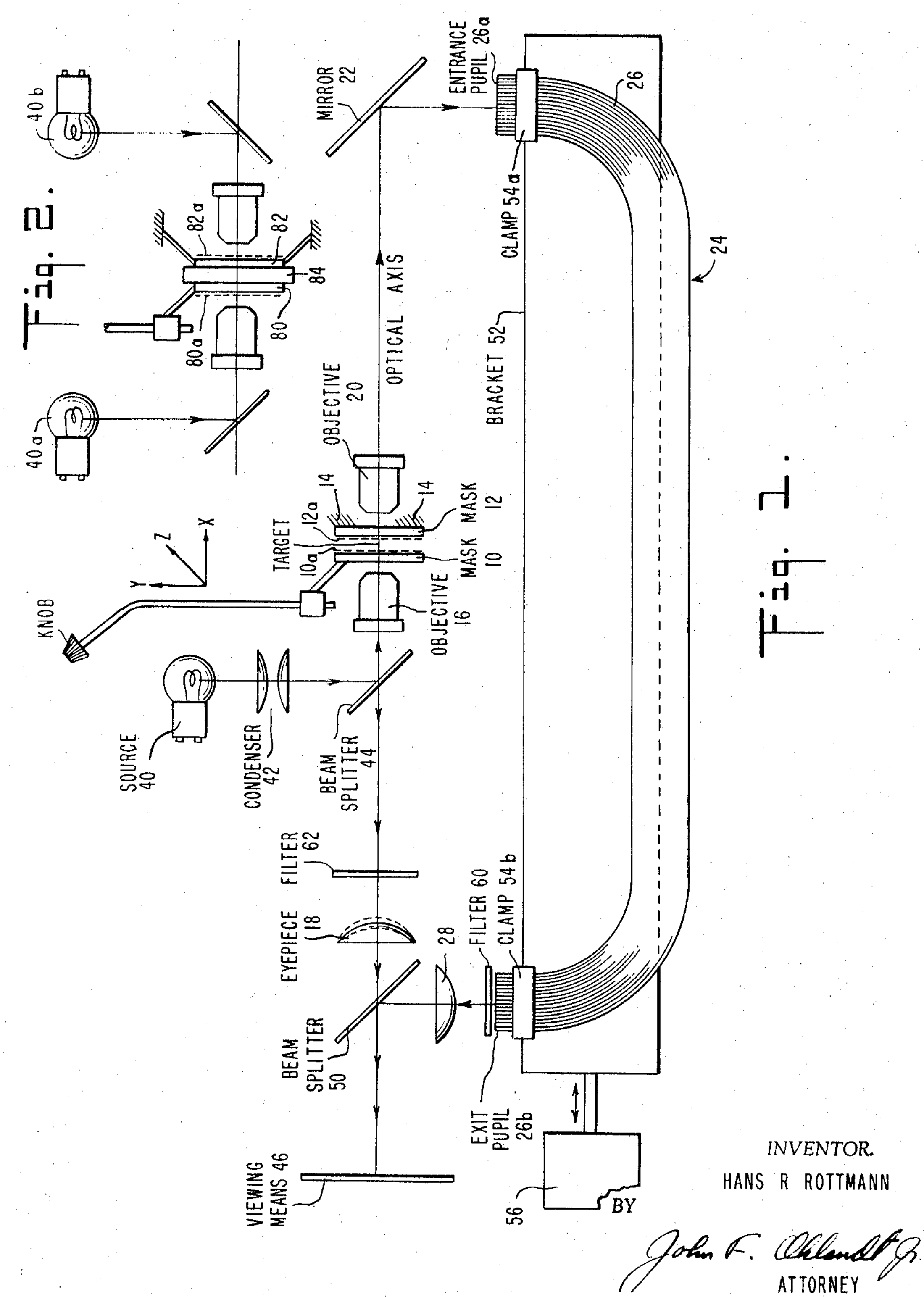
FIG. 1 is a schematic diagram of the apparatus of the present invention.
FIG. 2 is a modification of the apparatus.

Referring now to FIG. 1, there is shown a complete arrangement of an illustrative embodiment of the present invention. Two masks, 10 and 12, are shown mounted so as to face each other on a supporting member 14. In this embodiment the masks are typically photographic plates. The objective in this instance is to axially align the two masks 10 and 12. This is typically done by selection of a precise target pattern on the complete patterns **10*a* and 12*a* shown. Initially the masks are roughly aligned by hand. The mask 12 is fixed into position and is kept stationary while the mask 10 is adjusted in the X–Y plane relative to the stationary mask 12. The knob illustrated merely symbolizes this adjustability of the mask 10**.

The degree of alignment of the masks 10 and 12 is controlled by two separate microscopes. In effect, then, the alignment microscope illustrated in FIG. 1 is two-microscopes-in-one. The first microscope comprises an objective lens 16 and an eyepiece 18, which is preferably a zoom type eyepiece in the case where matching of both microscope magnifications becomes critical. The second microscope comprises an objective lens 20 and an associated eyepiece 28. However, there is shown inserted in the path between the objective lens 20 and the eyepiece 28 a fiber cable 24 which consists of a coherent fiber bundle 26 and includes entrance and exit pupils **26*a* and 26*b* respectively. Also provided in the same path is a mirror 22**.

The light from the source 40 passes through the condenser 42 and is deviated to the right by the beam splitter 44 and thence is directed toward the masks 10 and 12. Mask 10 reflects a portion of the incident light which is then projected on the screen 46 as a magnified image of mask 10. Another portion of the incident light goes through the mask 12. This portion is focussed by the objective lens 20 and by way of the mirror 22 onto the entrance pupil **26*a* of the fiber bundle 26. The fiber bundle 26 transmits this image to the exit pupil 26*b*. The eyepiece 28 then focusses the image and thence by means of the second beam splitter, that is, beam splitter 50, the magnified image of mask 12 is projected onto the viewing screen 46**.

The fiber bundle 26 is extremely advantageous in that it transmits the magnified image received at entrance pupil **26*a* practically without impairment of the resolution. This fiber bundle, as a means of transmitting images, is per se well-known. The fiber bundle 26** comprises coherently arranged groups of glass fibers which transmit an image by breaking it up into separate components and transmitting each of these components independently from one end of the array to the other. Each of the glass fibers making up the bundle typically is constructed of a core glass surrounded by a cladding glass of a lower index of refraction. Such fibers transmit images by total internal reflection. For a fuller appreciation of the usefulness of such a fiber bundle reference may be made to Hicks, J. W. and Kiritsy, P., "Fiber Optics," The Glass Industry, vol. 44, No. 4 (1962), pp. 193–196, 208–211.

It will be noted that the ends of the flexible cable 24 are clamped to a bracket 52 by means of clamps **54*a* and 54*b*. This bracket is slidably supported in such a manner that it may perform a harmonic oscillation (with an amplitude of approximately 0.01 inch). Such harmonic oscillation is provided only where image enhancement is required. In other words, it is sometimes the case with a fiber bundle that the image reproduced at the exit end is not as good as desired. In this event a dynamic system is employed. In effect, instead of one fiber transmitting an image point, several fibers are used to integrate the image. Mechanical vibration of the two ends of the fiber bundle 26 can be provided by virtue of reciprocating means 56 affixed to the slidable bracket 52. The movement is selected to be in the Z direction (as can be appreciated by reference to the double arrow shown at the left end of the bracket 52). It will be appreciated now that the mirror 22 has an important role to play because of the desirability, as aforenoted, in some instances of producing image enhancement by suitably moving the two ends of the fiber bundle 26. Thus, the planes of the entrance pupil 26*a* and the exit pupil 26*b* are to be made at least parallel and preferably coplanar. In this way, the movement of both ends is made exactly synchronous. It will be appreciated that the above-described synchronous motion is not required where the fiber bundle is providing a sufficiently good image. In that event, the mirror 22 can be omitted and the flexible cable 24 can be bent such that the entrance pupil 26*a* is brought around perpendicular to the optical axis shown. In other words, a bend of 270° can be provided in the flexible cable 24 so that the image can be brought around from the optical axis to the axis which is perpendicular to the exit pupil 26*b***.

As will now be understood from the foregoing description of operation, an observer to the left of the viewing means 46 will be able to see two distinctly magnified images representing the two masks, i.e. mask 10 and mask 12. Therefore, extremely fine adjustment can be made and the observer can now align the mask 10 relative to the mask 12 and this can be done with an accuracy of approximately $\pm 10 \times 10^{-6}$ inches. It should be noted here that although the viewing means has been shown in the form of a screen, that other well-known devices can be employed for the observation of the magnified images. It should also be noted that although it is not essential to the practice of the alignment technique of the present invention, the use of the color filters 60 and 62, which are shown interposed in the image paths, may improve the alignment accuracy of the two images.

Although the present invention has heretofore been considered as embodied using the apparatus shown in FIG. 1, it will be appreciated that the basic technique is quite generally applicable to the alignment of pattern-bearing matrices. Thus, in considering the embodiment of FIG. 1 it was found convenient to describe the operation with reference to the axial alignment of two masks in the form of photographic plates. However, the technique of the present invention is not limited thereto, and it will be apparent that other situations are comprehended thereby.

The technique of the present invention can be applied to situations, for example, where the mask material is opaque or where the masks are located on opposite surfaces of an opaque member such as a semiconductor wafer or the like. There is illustrated in FIG. 2 a modification of the alignment arrangement previously shown in FIG. 1. In this modification the situation is depicted of a plurality of pattern-bearing matrices in the form of the masks 80 and 82 having respective patterns 80*a* and 82*a* which are located on opposite surfaces of an opaque member 84. In this situation plural light sources are used; that is, rather than the source 40 as illustrated in FIG. 1, the source 40*a* and 40*b* are employed. Light source 40*a* is used for the mask 80, and light source 40*b* is used for mask 82. As before, the several objective lenses are provided and an additional beam splitter, but basically the modification of FIG. 2 is simply for the purpose of illuminating both masks by separate means. Hence the other elements that were described in connection with the first embodiment are also incorporated.

It will now be appreciated from the fact that the technique of the present invention can be applied to situations such as illustrated in the modification of FIG. 2, that the technique is perfectly general and may be further applied, for example in any situation where it is required to align target patterns regardless of the positioning of the masks. In other words, the masks can be placed in all sorts of planes and need not be in parallel planes as have been illustrated heretofore. Thus, where it is dictated that a target pattern on a pattern-bearing matrix be precisely located with respect to a fixed reference plane this can be very readily accomplished.

What has been disclosed herein is a unique arrangement and technique for the aligning of pattern-bearing matrices which overcome the disadvantages of the prior, one microscope technique. By the provision of two microscopes, one for each matrix involved, and by the use of a coherent fiber bundle in the path of one of these microscopes, there is enabled the attainment of a proper depth of focus for each mask image and a high degree of resolution. The resolution remains unimpaired because of the fineness of the individual glass fibers of the fiber bundle. The ultimate result is that a facility is provided for viewing magnified images of these pattern-bearing matrices, with the end in view of extremely accurate alignment of these matrices.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. Apparatus for aligning a plurality of closely spaced masks comprising:

means for producing distinct images of each of said masks, means for combining the distinct images by superimposition of one on another, said means for combining the mask images including means for transmitting one of said images without impairment of resolution, and means for adjusting the position of one mask relative to another until the combined images are aligned, said means for producing distinct images of each of said masks including a light source and an objective lens for each of said masks located on the outer side of each mask; said means for transmitting one of said images without impairment of resolution comprising a coherent fiber bundle having an entrance pupil at one end and an exit pupil at the other end.

2. Apparatus as defined in claim 1, wherein said means for combining the mask images includes a beam splitter, an eyepiece for each of said images located in the transmission path at a point immediately preceding said beam splitter and a viewing means.

3. An apparatus as defined in claim 2, wherein one of said eyepieces is a zoom eyepiece for matching of the magnification of the distinct images, and wherein said viewing means is a viewing screen.

4. Apparatus as defined in claim 1, wherein the ends of said coherent fiber bundle are clamped to a bracket and the planes of the entrance pupil are parallel.

5. Apparatus as defined in claim 4, including means for synchronous vibration of the entrance pupil and the exit pupil.

6. Apparatus as defined in claim 5, wherein the means for combining mask images includes a mirror for directing one of said distinct images onto said entrance pupil.

7. Apparatus as defined in claim 2, wherein said means for producing distinct images of each of said masks includes another light source, and another beam splitter.

References Cited

UNITED STATES PATENTS

| | | | |
|---|---|---|---|
| 2,155,248 | 4/1939 | Adams et al. | 88—24 |
| 2,747,284 | 5/1956 | Christoph | 33—125 |
| 3,016,785 | 1/1962 | Kapany | 350—96 |
| 3,207,904 | 9/1965 | Heinz | 88—14 XR |

FOREIGN PATENTS

| | | |
|---|---|---|
| 891,348 | 3/1962 | Great Britain. |

NORTON ANSHER, *Primary Examiner.*

ROBERT P. GREINER, *Assistant Examiner.*

U.S. Cl. X.R.

350—96; 356—138